United States Patent [19]

Zabinski et al.

[11] Patent Number: 5,282,985
[45] Date of Patent: Feb. 1, 1994

[54] LUBRICANT COATINGS

[75] Inventors: Jeffrey S. Zabinski; Michael S. Donley, both of Dayton, Ohio

[73] Assignee: The United States of America as represented by the Secretary of the Air Force, Washington, D.C.

[21] Appl. No.: 83,130

[22] Filed: Jun. 24, 1993

[51] Int. Cl.$^5$ .......................................... C10M 125/10
[52] U.S. Cl. .................. 252/12; 252/12.002; 252/25
[58] Field of Search .................. 252/12, 12.2, 25

[56] References Cited

U.S. PATENT DOCUMENTS

| | | | |
|---|---|---|---|
| 4,647,386 | 3/1987 | Jamison | 252/25 |
| 4,828,728 | 5/1989 | Dimigen et al. | 252/12.2 |
| 4,828,729 | 5/1989 | Centers | 252/25 |
| 4,965,001 | 10/1990 | King | 252/25 |
| 5,029,562 | 7/1991 | Kamo | 123/193 P |
| 5,100,848 | 3/1992 | Enomoto et al. | 501/132 |

OTHER PUBLICATIONS

Zabinski et al "Chemical and Tribological . . . ", Thin Solid Films, 214(2) pp. 156-163, Jul. 15, 1992.

Primary Examiner—Jacqueline V. Howard
Attorney, Agent, or Firm—Charles E. Bricker; Thomas L. Kundert

[57] ABSTRACT

Provided are methods for fabricating solid lubricant coatings capable of operating over a temperature range of at least 0° to 600° C. One embodiment comprises simultaneously applying a first solid lubricant and a second solid lubricant to a bearing surface, wherein the first solid lubricant has a normal operating temperature range of about −169° to +350° C. and the second solid lubricant has a normal operating temperature range of about 350° to 700° C. A second embodiment comprises applying multiple alternating layers of a first solid lubricant and a second solid lubricant to a bearing surface. A third embodiment comprises applying multiple alternating layers of (1) a first solid lubricant overlaid with a diffusion barrier and (2) a second solid lubricant overlaid with a diffusion barrier to a bearing surface. A fourth embodiment comprises applying at least one matrix layer consisting essentially of a first solid lubricant and a second solid lubricant dispersed in a diffusion barrier matrix to a bearing surface. The first and second solid lubricants in these embodiments are as described above. The diffusion barrier is a metal carbide, metal nitride or the like. The lubricant films prepared according to the invention are able to adapt to environmental changes such as temperature, atmosphere, pressure, radiation levels and the like. The adaptive nature of these lubricant films occurs through changes in crystal structure and reaction between the first and second solid lubricants, both with each other and with the atmosphere.

30 Claims, No Drawings

LUBRICANT COATINGS

RIGHTS OF THE GOVERNMENT

The invention described herein may be manufactured and used by or for the Government of the United States for all governmental purposes without the payment of any royalty.

BACKGROUND OF THE INVENTION

This invention relates to solid lubricant systems which exhibit stable lubricity over a wide temperature range.

Solid lubricants are required in applications where components are exposed to high temperatures, vacuum, intense radiation and other degrading environments. In particular, use of those components in precision applications (e.g., close tolerance gimbals, bearings, shafts and gears) requires a uniform thin coating. The space industry utilizes a significant number of precision components whose lubricant supply is not easily replenished after launch. Lubricant failure in systems requiring those components could cause mission failure. Increased demands on lubricant life are also found in high temperature engines and systems whose components are sealed and not readily accessible. There is a great need, therefore, to extend the wear life and environmental stability of solid lubricants used in the applications discussed above. Currently, solid lubricants are available that perform well in the low ($-196°$ to $+350°$ C.), intermediate (350° C. to 700° C.) and high (above 700° C.) temperature ranges. However, no lubricant is available that effectively spans all three ranges.

Molybdenum disulfide ($MoS_2$) has been a widely used solid lubricant for many years because it is readily available, provides a low friction coefficient, can bear high loads, and is somewhat resistant to oxidation up to about 350° C. Other dichalcogens have been used at temperatures up to 350° C. with varying degrees of success. PbO is useful in the intermediate temperature range from 350° C. to 700° C. and CaF-BaF mixtures provide lubrication at temperatures above 700° C.

Many methods exist for depositing lubricants; for example, they can be: rubbed, bonded (using an adherent polymer matrix), thermally sprayed, laser deposited, and sputtered onto components requiring lubrication and/or wear protection. Sputter deposition is currently the most widely used method to coat precision components with solid lubricants and the chemical, physical and mechanical properties of those coatings have been well characterized.

While sputter deposition is used to grow technologically important lubricant films, there are aspects of the sputter process that limit film quality. The most significant deficiencies are: contamination by background gases (i.e., $H_2O$, $O_2$, etc.), contamination by elements used in prior depositions, and porous morphology. Contamination from any source can compromise film integrity and prohibit good control of film properties. The porosity and morphology of some sputter deposited films exposes reactive edge planes to the environment where they are susceptible to degradation by oxidants.

Pulsed laser deposition (PLD) of lubricants provides coatings that are free from most deficiencies discussed above. The relative merits of PLD films are well known. One avenue used to increase the wear life of lubricant coatings is to incorporate additives. Graphite, $Sb_2O_3$, Ni and other metals have been combined with $MoS_2$. The limitation of current lubricant and deposition technology is that a lubricant that effectively spans a broad temperature range cannot be produced.

Accordingly, it is an object of this invention to provide an improved lubricant coating capable of performing over a temperature range of 0° to 600° C., preferably $-196°$ to 700° C. or greater.

Other objects, aspects and advantages of the present invention will be apparent to those skilled in the art after reading the detailed description of the invention as well as the appended claims.

SUMMARY OF THE INVENTION

In accordance with the present invention there is provided a method for fabricating solid lubricant coatings capable of operating over a temperature range of at least 0° to 600° C. which comprises simultaneously applying a first solid lubricant and a second solid lubricant to a bearing surface, wherein said first solid lubricant has a normal operating temperature range of about $-169°$ to $+350°$ C. and said second solid lubricant has a normal operating temperature range of about 350° to 700° C.

There is also provided a method for fabricating solid lubricant coatings capable of operating over a temperature range of at least 0° to 600° C. which comprises applying multiple alternating layers of a first solid lubricant and a second solid lubricant to a bearing surface, wherein said first solid lubricant has a normal operating temperature range of about $-169°$ to $+350°$ C. and said second solid lubricant has a normal operating temperature range of about 350° to 700° C.

There is further provided a method for fabricating solid lubricant coatings capable of operating over a temperature range of at least 0° to 600° C. which comprises applying multiple alternating layers of (1) a first solid lubricant overlaid with a diffusion barrier and (2) a second solid lubricant overlaid with a diffusion barrier to a bearing surface, wherein said first solid lubricant has a normal operating temperature range of about $-169°$ to $+350°$ C. and said second solid lubricant has a normal operating temperature range of about 350° to 700° C.

There is yet further provided a method for fabricating solid lubricant coatings capable of operating over a temperature range of at least 0° to 600° C. which comprises applying at least one matrix layer consisting essentially of a first solid lubricant and a second solid lubricant dispersed in a diffusion barrier matrix to a bearing surface, wherein said first solid lubricant has a normal operating temperature range of about $-169°$ to $+350°$ C. and said second solid lubricant has a normal operating temperature range of about 350° to 700° C.

DETAILED DESCRIPTION OF THE INVENTION

The lubricant films prepared according to the invention are able to adapt to environmental changes such as temperature, atmosphere, pressure, radiation levels and the like. The adaptive nature of these lubricant films occurs through changes in crystal structure and reaction between the first and second solid lubricants, both with each other and with the atmosphere.

Suitable solid lubricants having a normal operating temperature range of about $-169°$ to $+350°$ C. include $MoS_2$, $WS_2$, $MoTe_2$, $MoSe_2$, $WTe_2$, $WSe_2$, $NbS_2$, $NbSe_2$, $NbTe_2$, and the like. Suitable solid lubricants having a normal operating temperature range of about 350° to 700° C. include PbO, $TaS_2$, $TaSe_2$, $TaTe_2$, $Ag_2WO_4$, $Na_2WO_4$, $B_2O_3$, $MoO_3$, $WSe_2$-In-Ga, oxythiomolybdates, oxythiotungstates, and the like.

The first solid lubricant is any one of the above-listed solid lubricants. The second solid lubricant is any one of the other lubricants in the list having a cation moiety different from that of the first lubricant. It is presently preferred that the second solid lubricant have a normal operating temperature range different from that of the first solid lubricant. For example, if $MoS_2$ is selected as the first solid lubricant, then the second solid lubricant might be PbO. It is also preferred that the first and second solid lubricants be capable of chemical reaction to form one or more compounds having lubricating qualities. For example, $MoS_2$ and PbO can react in the presence of additional oxygen to ultimately form $PbMoO_4$. In practice, depending on the amounts of the two solid lubricants, reaction temperature(s), environment and the like, what is actually formed is a mixture of compounds including, but not limited to $MoS_w$, $PbMo_xS_yO_z$, $MoO_3$ and $S_n$, wherein n, w, x, y and z are numerical values indicative of the portions of each element present in the mixture. These values can be obtained from analysis of the mixture but are not intended to limit the invention, since the values are dependent upon a plurality of factors, including but not limited to proportions of reactants, reaction temperature atmosphere, and the like.

It is also within the scope of the invention to incorporate solid lubricants having a normal operating temperature above about 700° C. in the lubricant films. Suitable solid lubricants having a normal operating temperature above about 700° C. include ZnO, $PbMoO_4$, $PbWO_4$, $CuWO_4$, $CaF_2$, $CeF_3$, $WO_3$, $BaF_2$, $NiMoO_4$, $FeWO_4$, NiO, FeO, and the like.

It is further within the scope of the invention to incorporate additives in the lubricant films. Suitable additives include SnO, $Ag_2S$, $NiWO_4$, $K_2MoO_4$, $Ag_2MoO_4$, CuO, and the like.

The first and second lubricants should be selected so that they will react with each other and/or the operating environment as temperature increases to provide a third lubricant that provides lubricity at temperatures greater than about 700° C. Selection of the first and second lubricants can be made on the basis of known thermodynamic data, known reactions and high temperature lubrication data. The reaction of $MoS_2$, PbO and atmospheric oxygen is described previously. Other reactions of low and intermediate range lubricants with atmospheric oxygen include $PbO+WS_2+(O)$, $WS_2+(O)$, In one embodiment of the invention, the lubricant coatings are fabricated by simultaneously applying a first solid lubricant and a second solid lubricant to the bearing surface. Deposition of the composite coating may be accomplished using any of the methods listed previously. The presently preferred method of deposition is PLD because the solid lubricants can be intimately mixed in the deposited films. PLD also provides close control of the film thickness. Composite targets for PLD can be prepared by hot pressing an intimate mixture of the solid lubricant powders. PLD is further preferred because the temperature of the substrate can be varied during deposition to provide optimum conditions, as determined by simple experimentation. Deposited film chemistry can be monitored using X-ray photoelectron spectroscopy (XPS) and raman spectroscopy. The composite film should have a thickness of about 5000 to 10000 Å. The two lubricants jointly provide lubricity, or the two can react to form a high temperature lubricant as described previously to continue lubricity at a higher temperature.

Following deposition, the lubricant film can be annealed. Oven annealing should be carried out at about 300° C. for about 1 hour. Alternatively, the film may be annealed using an unfocused laser beam sufficient to provide at least about 30 $mJ/cm^2$, for example, 6 minutes at 10 Hz, 248 nm, 30 $mJ/cm^2$.

In a second embodiment of the invention, multiple alternating layers of the first and second solid lubricants are applied to the bearing substrate. Each layer should have a thickness of about 500 to 1000 Å. If, at the temperature of operation, the exposed lubricant layer does not provide sufficient lubricity, this embodiment provides two possible states of operation. First, the exposed layer, i.e., the layer exposed to the part in motion, wears completely away, thereby exposing the next layer, which should provide the desired lubricity. Second, the exposed layer wears in such manner that particles of that layer are incorporated into the next underlying layer, thereby providing a mixture of the two lubricants, wherein the two lubricants jointly provide lubricity, or the two can react to form a high temperature lubricant as described previously to continue at a higher temperature.

In a third embodiment of the invention, multiple alternating layers of (1) a first solid lubricant overlaid with a diffusion barrier and (2) a second solid lubricant overlaid with a diffusion barrier are applied to the bearing substrate. The diffusion can be a metal such as W, or a nitride, silicide, oxide, boride or carbide, such as, for example, $B_4C$, HfN, $MoSi_2$, $Al_2O_3$, $Cr_3C_2$, $TiB_2$, BN, TiC, HfC, SiC, TiN, or the like. The thickness of the diffusion barrier should be at least about 50 Å. A presently diffusion barrier is titanium carbide (TiC). If, as described above, at the temperature of operation, the exposed lubricant layer does not provide sufficient lubricity, the current layer, i.e., the layer exposed to the part in motion, wears completely away, thereby exposing the underlying diffusion barrier, which wears away exposing the next layer, which should provide the desired lubricity.

In a fourth embodiment of the invention, multiple layers of a composition consisting essentially of a first solid lubricant and a second solid lubricant, both dispersed as isolated inclusions in a diffusion barrier matrix are applied to the bearing substrate. The thickness of the matrix layer should be at least about 10000 to 20000 Å. A presently preferred matrix material is titanium carbide (TiC). The two solid lubricants physically mix as the layer is exposed to motion. Thus, lubricity is provided at temperatures up to the upper limit of the higher temperature lubricant. As temperature is increased, the lubricants react to form a high temperature lubricant to continue lubricity. When the temperature is reduced, the film wears away, but the matrix material shears, thereby exposing fresh low and moderate temperature lubricants. Thus, continuous lubrications is provided over a wide temperature cycle.

The following example illustrates the invention:

EXAMPLE

Deposition System

The vacuum system used for film deposition was constructed from a stainless steel chamber having a base pressure of $8 \times 10^{-7}$ Pa; the pressure during deposition rose to $1 \times 10^{-5}$ Pa. Composite targets were fabricated by mixing PbO (K&K Laboratories) and $MoS_2$ powders (climax Molybdenum Co., technical grade) in 1/1, 0.5/1, and 0.25/1 ($PbO/MoS_2$) molar ratios and hot pressing them into 1-inch diameter targets at about 500° C. and $1.5 \times 10^8$ Pa. A Lambda Physik LPX 110i excimer laser charged with KrF was operated at 10 Hz and 100 mJ/pulse to provide 248 nm radiation to the target. The beam was focused to a 2.9 mm by 6.5 mm rectangle on the target face providing a total fluence of 530 $mJ/cm^2$. Substrates were positioned about 5.0 cm from the target during deposition. The unfocused laser beam was used for post deposition anneals and provided 38 $mJ/cm^2$ to the film surface. Film uniformity was maximized by: (1) rotating the target and the substrate at about 10 rpm during deposition and (2) rastering the laser beam across the target face under computer control. Targets were polished with a lint cloth to minimize roughness and increase deposition rates. A calibrated quartz crystal oscillator was used to measure deposition rates and film thicknesses. Resistive heating was employed to degas the specimens. Targets were cleaned by ablating onto the back of the sample shutter prior to deposition.

Sample Preparation and Analysis

Substrates were fabricated from 440C stainless coupons that were polished to 0.01 mm and cleaned ultrasonically in hexane, acetone and methanol. Prior to deposition, the specimens were degassed at 573 K. for 1 h and allowed to cool to room temperature.

Deposition

The duration of each deposition was adjusted to provide films that were about 200.0 nm thick. Films were grown on substrates at room temperature (about 300 K.) and at 300° C. (about 573 K.) for several target compositions. Surface chemistry was studied with a Surface Science Instruments (SSI) M-probe XPS instrument operated at $3 \times 10^{-7}$ Pa using a 250 X 750 mm line spot and a 50 eV pass energy to provide a full width half maximum (FWHM) of 0.77 eV for the Au 4f7/2 peak. Building energy positions were calibrated using the Cu 3s and Cu 2p3/2 peaks at 122.39 and 932.47 eV, respectively. Bulk chemistry and film crystallinity were investigated by Raman spectroscopy using a SPEX 1877 spectrometer and the incident light of a 514.5 nm Ar ion laser. An intensified 1024 element, diode array detector was used to collect the Raman signal.

Friction Coefficients and Wear Lives

A ball-on-flat tribometer enclosed by a glass bell-jar was used to determine friction coefficients and wear lives. The testing procedure is briefly described as follows: (1) a 440C stainless steel coupon 27 HRC), was mounted horizontally on a rotatable spindle, (2) a 0.32 cm diameter 440C stainless steel ball (57 HRC) was loaded with a 100 g weight to create a Hertzian stress of 0.98 GPa on the substrate surface during tribotesting, (3) the bell-jar was evacuated to about 1 Pa and back-filled with dry nitrogen, and (4) the substrate disks were rotated at 200 rpm while the ball was positioned on a 1.6 cm diameter track. All tribo-tests were conducted with the substrate at room temperature. Wear life was defined as the number of revolutions before the friction reaches 0.4; film failure was always catastrophic.

RESULTS

Surface chemistry was evaluated by analysis of binding energies, spectral areas, and peak full-width-half-maximums (FWHM) determined by fitting XPS spectra to Voight functions. Measured spectral areas from XPS data and sensitivity factors from SSI were used to determine the relative mole fractions of components near surfaces.

The $PbO-MoS_2$ (0.25/1, 0.5/1 and 1/1-$PbO/MoS_2$ molar ratio) films deposited at 300 K. provided featureless Raman spectra. This indicates that film components were not Raman active or that crystalline domains were less than about 25 Å in diameter. Table I lists curve fitting parameters and relative fractions of film components. The friction coefficients and the wear lives of the composite films are listed in Table II.

TABLE I

| | | Pb 4f$_{7/2}$ | | Mo 3d$_{5/2}$ | | S 2p$_{3/2}$ | | O 1s | |
|---|---|---|---|---|---|---|---|---|---|
| | % of total | Binding Energy (eV) | FWHM (eV) | Binding Energy (eV) | FWHM (eV) | Binding Energy (eV) | FWHM (eV) | Binding Energy (eV) | FWHM (eV) |
| 0.25:1 PbO—MoS$_2$ | | | | | | | | | |
| MoS$_{2.1}$ | 38.0 | | | 228.63 | 1.24 | 161.73 | 1.33 | | |
| PbMo$_{0.76}$S$_{1.7}$O$_{1.4}$ | 12.0 | 137.68 | 1.19 | 229.65 | 1.34 | 160.83 | 1.20 | 530.66 | 1.95 |
| PbMoO$_4$—MoO$_3$ | 1.0 | 138.71 | 1.05 | | | 163.00 | 1.33 | | |
| S$_n$ | 49.0 | | | | | | | | |
| 0.50:1 PbO—MoS$_2$ | | | | | | | | | |
| MoS$_{2.0}$ | 34.0 | | | 228.65 | 1.23 | 161.79 | 1.21 | | |
| PbMo$_{0.76}$S$_{1.7}$O$_{1.4}$ | 47.0 | 137.6 | 1.15 | 229.96 | 1.32 | 160.85 | 1.18 | 530.24 | 1.62 |
| PbMoO$_4$—MoO$_3$ | 3.0 | 138.80 | 0.79 | 231.52 | 1.30 | | | | |
| S$_n$ | 16.0 | | | | | 163.04 | 1.10 | | |
| 0.50:1 PbO—MoS$_2$ | | | | | | | | | |
| MoS$_{2.0}$ | 23.0 | | | 228.72 | 1.19 | 161.89 | 1.10 | | |
| PbMo$_{0.76}$S$_{1.7}$O$_{1.4}$ | 68.0 | 137.67 | 1.12 | 229.93 | 1.55 | 160.88 | 1.13 | 530.29 | 1.52 |
| PbMoO$_4$—MoO$_3$ | 2.0 | 138.62 | 0.78 | 231.52 | 1.30 | | | | |
| S$_n$ | 7.0 | | | | | 163.04 | 1.01 | | |

The mole fractions of Pb, Mo and S listed in Table I show that film surfaces have greater proportions of Pb and S than expected from target compositions and are oxygen-deficient. The level of sulfur enrichment at the surface agrees with earlier studies of PLD $MoS_2$ films.

Films are amorphous or their crystalline domains are less than 25 Å in diameter, as illustrated by Raman spectra that are entirely featureless (not shown). Raman spectra of those films, after laser annealing, demonstrate the presence of crystalline $MoS_2$. It is likely that amorphous $MoS_2$ was present before annealing and that laser irradiation merely served to nucleate crystals that were large enough for detection by Raman spectroscopy. The relative concentration of $MoS_2$ in the films increases with the fraction of $MoS_2$ in the targets. No other components were observed in the Raman spectra. The areas of the Mo 3d5/2 and S 2p3/2 peaks at about 229 and 162 eV, respectively, were used to evaluate the relative fraction of $MoS_2$ in the films. In general, the mole fraction of $MoS_2$ in the increases with the mole fraction of $MoS_2$ in the targets, while the fraction of $PbMoO_4$ and/or $MoO_3$ and $PbMo_xS_yO_z$ decreases. $PbMoO_4$ and $MoO_3$ could not be deconvoluted because their Mo 3d binding energies overlap and they are present in small quantities (i.e., 1.0–3.0%). The formation of $PbMoO_4$ and $MoO_3$ is thermodynamically favored under equilibrium conditions. Thermal annealing 1/1 $PbO-MoS_2$ film in air at 773K produces $PbMoO_4$, $MoO_3$, and crystalline $MoS_2$. The $PbMoO_4$ produced provides lubricity to over 1000° C.

TABLE II

| | Friction coefficients and wear lives | | | |
| --- | --- | --- | --- | --- |
| | 300K | | 573K | |
| | μ | wl* | μ | wl* |
| 1:1 PbO—MoS₂ | 0.04 | 369 | 0.04 | 390 |
| 1:2 PbO—MoS₂ | 0.03 | 395 | 0.05 | 375 |
| 1:4 PbO—MoS₂ | 0.04 | 285 | 0.03 | 311 |
| MoS₂ | 0.03 | 70 | 0.04 | 290 |

*Wear life, ×1000 cycles

The friction coefficients of all three films (1:4, 1:2, 1:1) were nearly identical as shown in Table II. The 0.5/1 (1:2) film provided the lowest coefficient and the longest wear life. These data clearly show that $PbO$-$MoS_2$ films have significantly longer wear lives than $MoS_2$ or $PbO$ single component films. $PbO$-$MoS_2$ films last about 5 times longer than pure $MoS_2$ films deposited at room temperature. It should be noted that the composite films were only ¼ as thick as the 100% $MoS_2$ film. For thin $MoS_2$ films, it is generally known that wear life increases almost linearly with thickness.

Various modifications may be made without departing from the spirit and scope of the appended claims.

We claim:

1. A method for fabricating solid lubricant coatings capable of operating over a temperature range of at least 0° to 600° C. which comprises applying multiple alternating layers of (1) a first solid lubricant overlaid diffusion barrier and (2) a second solid lubricant overlaid with a diffusion barrier to a bearing surface, wherein said first solid lubricant has a normal operating temperature range of about −169° to +350° C. and said second solid lubricant has a normal operating temperature range of about 350° to 700° C.

2. The method of claim 1 wherein said first solid lubricant is selected from the group consisting of $MoS_2$, $WS_2$, $MoTe_2$, $MoSe_2$, $WTe_2$, $WSe_2$, $NbS_2$, $NbSe_2$ and $NbTe_2$; and said second solid lubricant is selected from the group consisting of $PbO$, $TaS_2$, $TaSe_2$, $TaTe_2$, $Ag_2WO_4$, $Na_2WO_4$, $B_2O_3$, $MoO_3$, $WSe_2$-In-Ga, oxythiomolybdates and oxythiotungstates.

3. The method of claim 1 wherein said diffusion barrier is selected from the group consisting of $B_4C$, HfN, $MoSi_2$, $Al_2O_3$, $Cr_3C_2$, $TiB_2$, BN, TiC, HfC, SiC and TiN.

4. The method of claim 2 wherein said first solid lubricant is $MoS_2$ and said second solid lubricant is $PbO$.

5. The method of claim 4 wherein said diffusion barrier is titanium carbide.

6. The method of claim 1 wherein each alternating layer has a thickness of about 500 to 1000 Å and said diffusion barrier has a thickness at least about 50 Å.

7. The method of claim 1 further comprising incorporating a solid lubricant having a normal operating temperature range above about 700° C. in at least one of said layers.

8. The method of claim 1 further comprising incorporating an additive selected from the group consisting of SnO, $Ag_2S$, $NiWO_4$, $K_2MoO_4$, $Ag_2MoO_4$ and CuO in at least one of said layers.

9. A method for fabricating solid lubricant coatings capable of operating over a temperature range of at least 0° to 600° C. which comprises applying multiple alternating layers of a first solid lubricant and a second solid lubricant to a bearing surface, wherein said first solid lubricant has a normal operating temperature range of about −169° to +350° C. and said second solid lubricant has a normal operating temperature range of about 350° to 700° C.

10. The method of claim 9 wherein said first solid lubricant is selected from the group consisting of $MoS_2$, $WS_2$, $MoTe_2$, $MoSe_2$, $WTe_2$, $WSe_2$, $NbS_2$, $NbSe_2$ and $NbTe_2$; and said second solid lubricant is selected from the group consisting of $PbO$, $TaS_2$, $TaSe_2$, $TaTe_2$, $Ag_2WO_4$, $Na_2WO_4$, $B_2O_3$, $WSe_2$-In-Ga, oxythiomolybdates and oxythiotungstates.

11. The method of claim 9 further comprising the step of annealing the resulting item.

12. The method of claim 9 wherein each alternating layer has a thickness of about 500 to 1000 Å.

13. The method of claim 10 wherein said first solid lubricant is $MoS_2$ and said second solid lubricant is $PbO$.

14. The method of claim 9 further comprising incorporating a solid lubricant having a normal operating temperature range above about 700° C. in at least one of said layers.

15. The method of claim 9 further comprising incorporating an additive selected from the group consisting of SnO, $Ag_2S$, $NiWO_4$, $K_2MoO_4$, $Ag_2MoO_4$ and CuO in at least one of said layers.

16. A method for fabricating solid lubricant coatings capable of operating over a temperature range of at least 0° to 600° C. which comprises simultaneously applying a first solid lubricant and a second solid lubricant to a bearing surface, wherein said first solid lubricant has a normal operating temperature range of about −169° to +350 ° C. and said second solid lubricant has a normal operating temperature range of about 350° to 700° C.

17. The method of claim 16 wherein said first solid lubricant is selected from the group consisting of $MoS_2$, $WS_2$, $MoTe_2$, $MoSe_2$, $WTe_2$, $WSe_2$, $NbS_2$, $NbSe_2$ and $NbTe_2$; and said second solid lubricant is selected from the group consisting of $PbO$, $TaS_2$, $TaSe_2$, $TaTe_2$, $Ag_2WO_4$, $Na_2WO_4$, $B_2O_3$, $MoO_3$, $WSe_2$-In-Ga, oxythiomolybdates and oxythiotungstates.

18. The method of claim 17 wherein said first solid lubricant is $MoS_2$ and said second solid lubricant is $PbO$.

19. The method of claim 16 wherein the resulting composite layer has a thickness of about 5000 to 10000 Å.

20. The method of claim 16 further comprising the step of annealing the resulting item.

21. The method of claim 16 further comprising incorporating a solid lubricant having a normal operating temperature range above about 700° C. in said layer.

22. The method of claim 16 further comprising incorporating an additive selected from the group consisting of SnO, $Ag_2S$, $NiWO_4$, $K_2MoO_4$, $Ag_2MoO_4$ and CuO in said layer.

23. A method for fabricating solid lubricant coatings capable of operating over a temperature range of at least 0° to 600° C. which comprises applying at least one matrix layer consisting essentially of a first solid lubricant and a second solid lubricant dispersed in a diffusion barrier matrix to a bearing surface, wherein said first solid lubricant has a normal operating temperature range of about −169° to +350° C. and said second solid lubricant has a normal operating temperature range of about 350° to 700° C.

24. The method of claim 23 wherein said first solid lubricant is selected from the group consisting of $MoS_2$, $WS_2$, $MoTe_2$, $MoSe_2$, $WTe_2$, $WSe_2$, $NbS_2$, $NbSe_2$ and $NbTe_2$; and said second solid lubricant is selected from the group consisting of PbO, $TaS_2$, $TaSe_2$, $TaTe_2$, $Ag_2WO_4$, $Na_2WO_4$, $B_2O_3$, $MoO_3$, $Wse_2$-In-Ga, oxythiomolybdates and oxythiotungstates.

25. The method of claim 23 wherein said matrix is selected from the group consisting of $B_4C$, HfN, $MoSi_2$, $Al_2O_3$, $Cr_3C_2$, $TiB_2$, BN, TiC, HfC, SiC and TiN.

26. The method of claim 24 wherein said first solid lubricant is $MoS_2$ and said second solid lubricant is PbO.

27. The method of claim 25 wherein said matrix is titanium carbide.

28. The method of claim 23 wherein matrix layer has a thickness of about 10000 to 20000 Å.

29. The method of claim 23 further comprising incorporating a solid lubricant having a normal operating temperature range above about 700° C. in said matrix.

30. The method of claim 23 further comprising incorporating an additive selected from the group consisting of SnO, $Ag_2S$, $NiWO_4$, $K_2MoO_4$, $Ag_2MoO_4$ and CuO in said matrix.

* * * * *